US009224610B2

(12) United States Patent
Kim et al.

(10) Patent No.: US 9,224,610 B2
(45) Date of Patent: Dec. 29, 2015

(54) INTEGRATED CIRCUITS HAVING IMPROVED HIGH-K DIELECTRIC LAYERS AND METHODS FOR FABRICATION OF SAME

(71) Applicant: GLOBALFOUNDRIES, Inc., Grand Cayman (KY)

(72) Inventors: Hoon Kim, Guilderland, NY (US); Kisik Choi, Hopewell Junction, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/931,205

(22) Filed: Jun. 28, 2013

(65) Prior Publication Data

US 2015/0001643 A1    Jan. 1, 2015

(51) Int. Cl.

| H01L 21/336 | (2006.01) |
|---|---|
| H01L 21/28 | (2006.01) |
| H01L 29/51 | (2006.01) |
| H01L 21/02 | (2006.01) |
| H01L 29/66 | (2006.01) |

(52) U.S. Cl.
CPC ........ *H01L 21/28229* (2013.01); *H01L 21/022* (2013.01); *H01L 21/02181* (2013.01); *H01L 21/28185* (2013.01); *H01L 29/513* (2013.01); *H01L 29/517* (2013.01); *H01L 29/66545* (2013.01)

(58) Field of Classification Search
CPC ............ H01L 21/022; H01L 21/28185; H01L 21/823857; H01L 21/02175; H01L 21/02178; H01L 21/0214; H01L 21/76888; H01L 29/517; H01L 29/66545; H01L 29/513; H01L 21/28229; H01L 21/02181
USPC ................. 438/770, 785, 240, 608, 768, 197; 257/E21.444; 439/591
See application file for complete search history.

(56) References Cited

U.S. PATENT DOCUMENTS

| 7,144,816 | B2 * | 12/2006 | Barns et al. | 438/692 |
|---|---|---|---|---|
| 7,683,418 | B2 * | 3/2010 | Park et al. | 257/310 |
| 2006/0189156 | A1 * | 8/2006 | Doczy et al. | 438/778 |
| 2012/0032281 | A1 * | 2/2012 | Haneda | 257/411 |
| 2013/0078779 | A1 * | 3/2013 | Xu | 438/299 |

* cited by examiner

*Primary Examiner* — Michael Trinh
(74) *Attorney, Agent, or Firm* — Ingrassia Fisher & Lorenz, P.C.

(57) ABSTRACT

Integrated circuits and methods for fabricating integrated circuits are provided. In accordance with an exemplary embodiment, a method for fabricating an integrated circuit includes exposing a portion of a surface of a semiconductor substrate between a first spacer and a second spacer. The method further includes selectively forming a dielectric layer on the portion of the surface. A metal gate is formed over the dielectric layer and between the first spacer and the second spacer. The metal gate contacts the first spacer and the second spacer.

17 Claims, 4 Drawing Sheets

INTEGRATED CIRCUITS HAVING IMPROVED HIGH-K DIELECTRIC LAYERS AND METHODS FOR FABRICATION OF SAME

TECHNICAL FIELD

The present disclosure generally relates to integrated circuits and methods for fabricating integrated circuits, and more particularly relates to integrated circuits having improved high-k dielectric layers and methods for fabricating integrated circuits with improved high-k dielectric layers.

BACKGROUND

As the critical dimensions of integrated circuits continue to shrink, the fabrication of gate electrodes for complementary metal-oxide-semiconductor (CMOS) transistors has advanced to replace silicon dioxide and polysilicon with high-k dielectric materials and metals. A replacement metal gate process is often used to form the gate electrode. A typical replacement metal gate process begins by forming a sacrificial gate oxide material and a sacrificial gate between a pair of spacers on a semiconductor substrate. After further processing steps, the sacrificial gate oxide material and sacrificial gate are removed and the resulting recess is filled with a high-k dielectric and one or more metal layers. The metal layers can include workfunction metals as well as electrode plug metals.

With technology scaling, the distance between the source and drain regions of a transistor, i.e., transistor channel length, also is reduced. As the channel length is reduced to increase the number of components per chip, short-channel effects arise. Short-channel effects include drain-induced barrier lowering and punchthrough, surface scattering, velocity saturation, impact ionization, and hot electron effect, all of which are detrimental to transistor performance. Short-channel effects are attributed to two physical phenomena: the limitation imposed on electron drift characteristics in the channel; and the modification of the threshold voltage due to the shortening channel length. Threshold voltage is known to increase or "roll-up" as channel length shrinks Accordingly, it is desirable to provide integrated circuits having improved high-k dielectric layers and methods for fabricating such integrated circuits. Also, it is desirable to provide integrated circuits having improved replacement metal gates. Further, it is desirable to provide methods for fabricating integrated circuits that provide techniques for selective formation of high-k dielectric layers in replacement metal gate structures. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes exposing a portion of a surface of a semiconductor substrate between a first spacer and a second spacer. The method further includes selectively forming a dielectric layer on the portion of the surface. A metal gate is formed over the dielectric layer and between the first spacer and the second spacer. The metal gate contacts the first spacer and the second spacer.

In another embodiment, a method for fabricating an integrated circuit is provided and includes providing a semiconductor substrate having a surface. The method deposits a metal overlying the semiconductor substrate to form a metal layer with a bottom side and a top side. The method further includes diffusing oxygen through the bottom surface of the metal and forming a metal oxide high-k dielectric layer.

In accordance with another embodiment, an integrated circuit is provided and includes a semiconductor substrate and a replacement metal gate formed over the semiconductor substrate. The replacement metal gate includes a high-k dielectric layer formed over the semiconductor substrate and between a first spacer and a second spacer. The replacement metal gate further includes a work function metal formed over the high-k dielectric layer and contacting the first spacer and the second spacer.

BRIEF DESCRIPTION OF THE DRAWINGS

Embodiments of the integrated circuits having improved high-k dielectric layers and methods for fabricating integrated circuits having improved high-k dielectric layers will hereinafter be described in conjunction with the following drawing figures, wherein like numerals denote like elements, and wherein.

DETAILED DESCRIPTION

Figure 1:
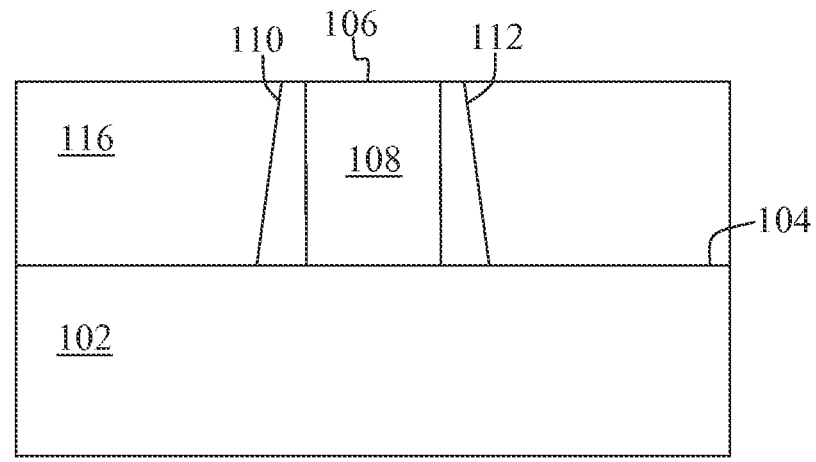
FIGS. 1-8 illustrate, in cross section, a portion of an integrated circuit and method steps for fabricating the integrated circuit in accordance with various embodiments herein.

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having improved high-k dielectric layers and methods for fabricating integrated circuits having improved high-k dielectric layers are provided. Generally, the following embodiments relate to the formation of an integrated circuit including, but not limited to, High-k/Metal Gate (HKMG) structures and processing. In conventional HKMG processing, a high-k dielectric layer is deposited in a recess bounded by spacers and forms an interior cavity. A workfunction or electrode metal or multiple layers of such metals are deposited to fill the interior cavity. The resulting metal gate is separated from the spacers by the high-k dielectric layer. Such a structure experiences increased threshold voltages as channel length shrinks.

In contrast, the integrated circuits and methods for fabricating integrated circuits described herein suppress the threshold voltage roll-up faced by conventional HKMG structures and processes. Specifically, the high-k dielectric layer is selectively formed only on the semiconductor substrate and not on the sidewalls of the spacers in the recess. In an exemplary embodiment, the methods for fabricating integrated circuits include oxidizing the semiconductor material at the bottom of the recess to form a layer of oxide, depositing a metal onto the layer of oxide, and diffusing oxygen from the layer of oxide into the metal to form a metal oxide high-k dielectric layer. In this process, high-k dielectric is not formed on the sidewalls of the spacers. As a result, a workfunction and/or electrode plug metal can be deposited over the metal oxide high-k dielectric layer and in contact with each spacer.

Thus, a metal gate is formed in contact with each spacer, increasing the length of the metal gate and reducing threshold voltage as compared to conventional HKMG structures.

FIGS. 1-8 illustrate sequentially a method for fabricating an integrated circuit having a selectively deposited high-k dielectric layer in accordance with various embodiments herein. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Turning now to FIG. 1, in an exemplary embodiment, the process of fabricating an integrated circuit 100 begins by providing a semiconductor substrate 102. The semiconductor substrate 102 for example is a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Further, the semiconductor substrate 102 may optionally include an epitaxial layer (epi layer). The semiconductor substrate 102 has an upper surface 104.

A gate structure 106 is formed overlying the upper surface 104 of the semiconductor substrate 102 according to well-known processes. As used herein "overlying" means "on" and "over". In this regard, the gate structure 106 may lie directly on the upper surface 104 such that it makes physical contact with upper surface 104 or it may lie over the upper surface 104 such that another material layer, for example, another semiconductor material layer, is interposed between the upper surface 104 and gate structure 106. As shown, the gate structure 106 includes a sacrificial gate 108 surrounded by a first spacer 110 and a second spacer 112. In an exemplary embodiment, the spacers 110 and 112 are nitride, such as silicon nitride, silicon carbon nitride, or silicon-carbon-oxy-nitride. As shown, a dielectric layer 116 is deposited around the gate structure 106 and is planarized to expose the sacrificial gate 108.

Figure 2:
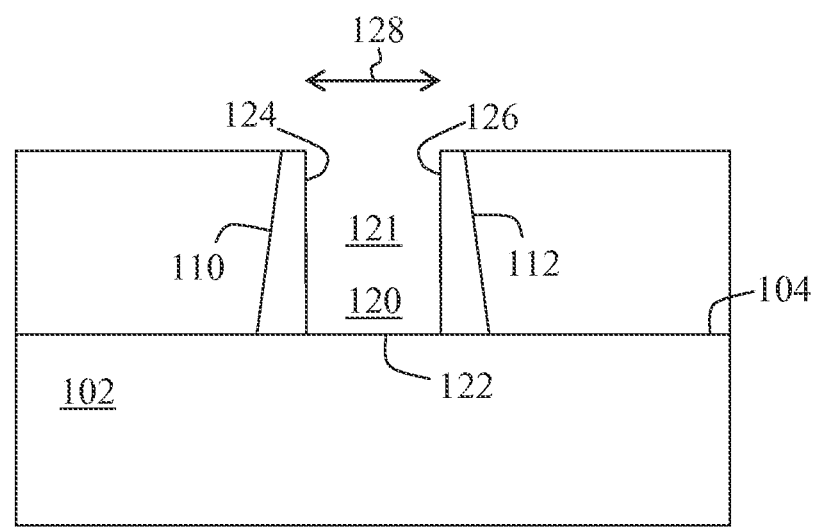

In FIG. 2, the sacrificial gate 108 is removed from the integrated circuit 100 according to conventional replacement gate processing. As a result, a recess 120 is formed in the gap 121 between the spacers 110 and 112. The recess 120 is bounded by a portion 122 of the upper surface 104 of the semiconductor substrate 102, by an inner sidewall 124 of first spacer 110, and by an inner sidewall 126 of second spacer 112. As shown in FIG. 2, the first spacer 110 and second spacer 112 are separated by a distance indicated by double-headed arrow 128.

Figure 3:
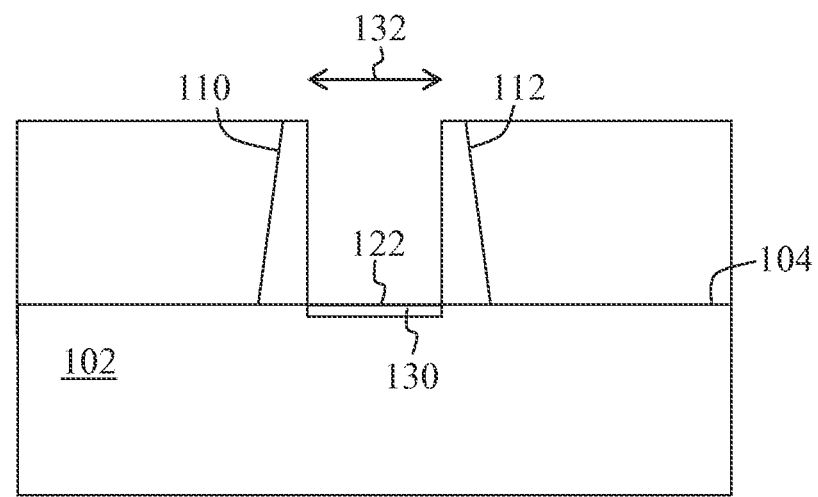

As illustrated in FIG. 3, the portion 122 of the upper surface 104 of the semiconductor substrate 102 is oxidized and an oxide layer 130 is formed. In an exemplary embodiment, the semiconductor substrate 102 is silicon and the upper surface 104 is oxidized using ozone to form an oxide layer 130 of a silicon oxide, such as silicon dioxide. In exemplary embodiments, the oxide layer is formed by chemical oxidation, dry oxidation, or wet oxidation. In an exemplary embodiment, the thickness of the oxide layer 130 is from about 5 to about 20 angstroms, such as about 10 angstroms. As shown, the oxide layer 130 has a length, indicated by double-headed arrow 132, that is substantially equal to the distance 128 between the first spacer 110 and the second spacer 112.

Figure 4:
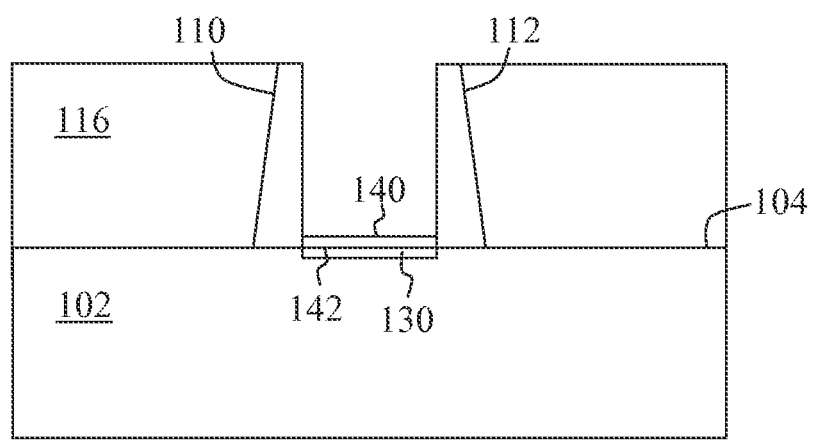

Next, a metal is deposited overlying the integrated circuit 100 as shown in FIG. 4. Specifically, the metal is deposited over the oxide layer 130 and the dielectric layer 116. The metal overlying the dielectric layer is removed, as shown, such as by chemical mechanical planarization (CMP). The metal overlying the oxide layer 130 forms a metal layer 140, as illustrated in FIG. 4. As shown, the metal layer 140 has a bottom surface 142 abutting the oxide layer 130. In an exemplary embodiment, the metal is deposited by atomic layer deposition (ALD) and forms the metal layer 140 with a thickness of from about 5 to about 20 angstroms, such as about 10 angstroms. While the metal may be selected from any metal suitable for deposition and formation of a high-k metal oxide, in an exemplary embodiment it is hafnium. Other exemplary metals include lanthanides, aluminum, magnesium, titanium, and tantalum.

Figure 5:
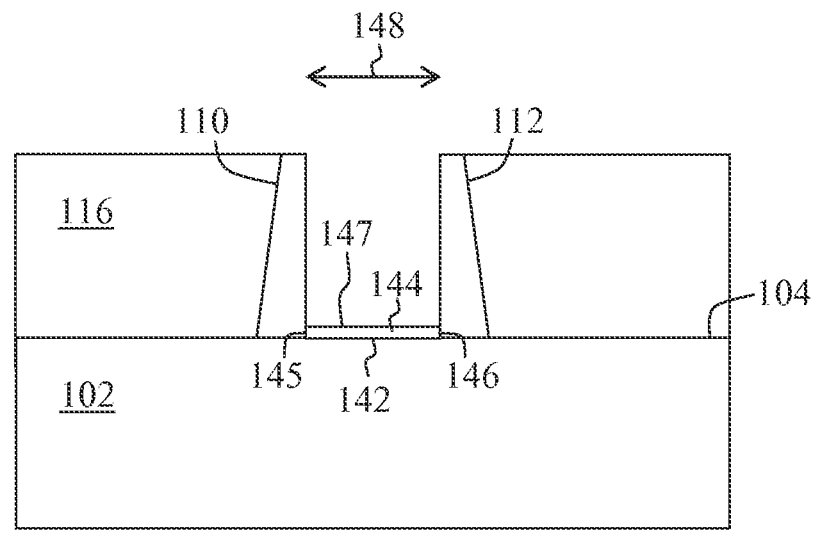

Referring to FIG. 5, a thermal treatment is performed to cause oxygen to migrate from the oxide layer 130 and through the bottom surface 142 to diffuse into the metal layer 140 to form a metal oxide high-k dielectric layer 144. An exemplary thermal treatment heats the integrated circuit 100 at about 200° C. to about 1200° C. for a duration of about a millisecond to a few (less than 5) minutes. In the illustrated embodiment of FIG. 5, substantially all of the oxygen is removed from oxide layer 130 such that oxide layer 130 is no longer present in the semiconductor substrate 102. In other embodiments, some oxygen may remain in the semiconductor substrate 102 such that oxide layer 130, though reduced in size, is still present at the upper surface 104 of the semiconductor substrate 102.

As shown in FIG. 5, the metal oxide high-k dielectric layer 144 extends between a first end 145 and a second end 146 and terminates at a substantially planar upper surface 147 that is parallel with upper surface 104 of the semiconductor substrate 102. The substantially planar upper surface 147 of the metal oxide high-k dielectric layer 144 contacts the first spacer 110 at the first end 145 and contacts the second spacer 112 at the second end 146. As shown, the substantially planar upper surface 147 of the metal oxide high-k dielectric layer 144 has a length indicated by double-headed arrow 148 that is equal to the distance 128 between the first spacer 110 and the second spacer 112. It is noted that if the selective metal deposition performed in FIG. 4 is not performed perfectly, there could be some metal deposited on the spacer surfaces. After the annealing process to transform metal layer 140 into metal oxide high-k dielectric layer 144, the unreacted metal on the spacer surface can be removed by metal wet etchant which is selective to metal oxide over metal. An exemplary wet etchant is a 20:1:1 mixture of $H_2O:HF:H_2O_2$ or mixture of other acidic or basic solutions such as HCl, $H_2SO_4$, HF, $H_2O_2$, $NH_4OH$).

Figure 6:
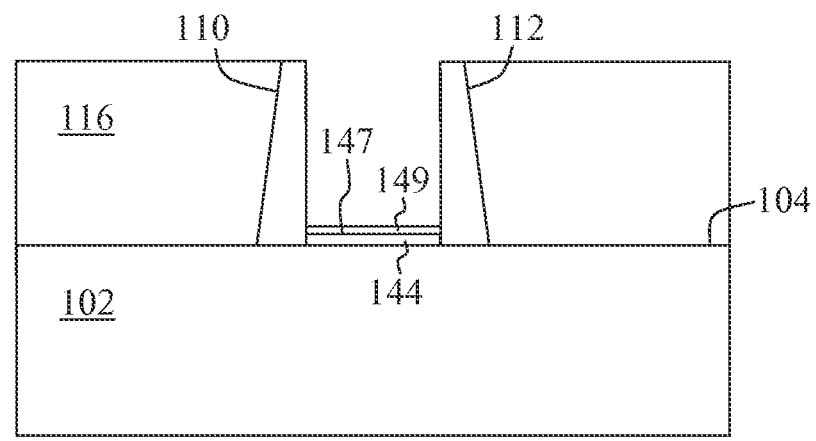
Figure 7:
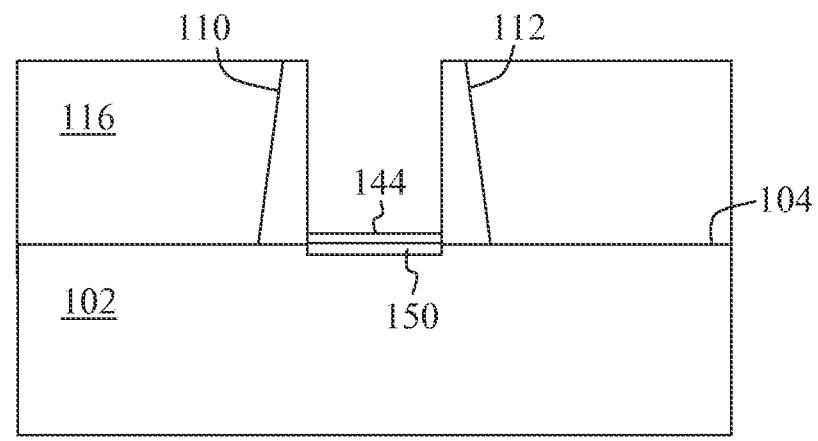

FIGS. 6-7 illustrate an optional step of regrowing or re-forming oxide at the upper surface 104 of the semiconductor substrate 102 to form an interfacial layer 150. Regrown or re-formed oxide generally exhibits improved consistency and provides for improved device performance. For example, regrown silicon dioxide typically exhibits less metal (high-k) impurity than originally formed silicon dioxide. In an exemplary process, a high temperature anneal process is performed at about 500° C. to about 1200° C. for a duration of about one nanosecond to about one minute to diffuse oxygen back into the semiconductor substrate 102 to form the interfacial layer 150, as shown in FIG. 7. An exemplary interfacial layer 150 is silicon dioxide and has a thickness of from about 5 to about 15 angstroms. When regrowing the interfacial layer 150, oxygen supporting regrowth can be supplied by oxygen contained in the metal oxide of the metal oxide high-k dielectric layer 144.

Additionally or alternatively, oxygen supporting regrowth can be supplied by oxygen contained in an optional capping layer 149 formed on the metal oxide high-k dielectric layer 144 in FIG. 6. Specifically, the capping layer 149 may be formed by depositing a capping material onto the upper surface 147 of the metal oxide high-k dielectric layer 144 before the anneal process for regrowing the interfacial layer 150. The capping material can include one or more layers formed by ALD and may include TiN, TaN, TiC, TaC, WN or an oxygen containing metal or metal alloy. In an exemplary embodiment, the capping layer 149 includes a layer of TiN having thickness of about 1 nanometer (nm) to about 5 nm. The exemplary capping layer 149 further includes amorphous silicon formed on the TiN before the high temperature anneal for reliability improvement. The capping layer 149 contains oxygen in it to provide an oxygen source for regrowth of the interfacial layer 150 during high temperature anneal. Thus, oxygen from the capping layer 149 may be diffused into the semiconductor substrate 102 to form the interfacial layer 150. The capping layer 149 is sacrificial and is removed after the anneal is completed and the interfacial layer 150 is formed as shown in FIG. 7. Thereafter, the main work function metal stack deposition may be performed and the replacement metal gate structure completed as illustrated in FIG. 8.

Figure 8:
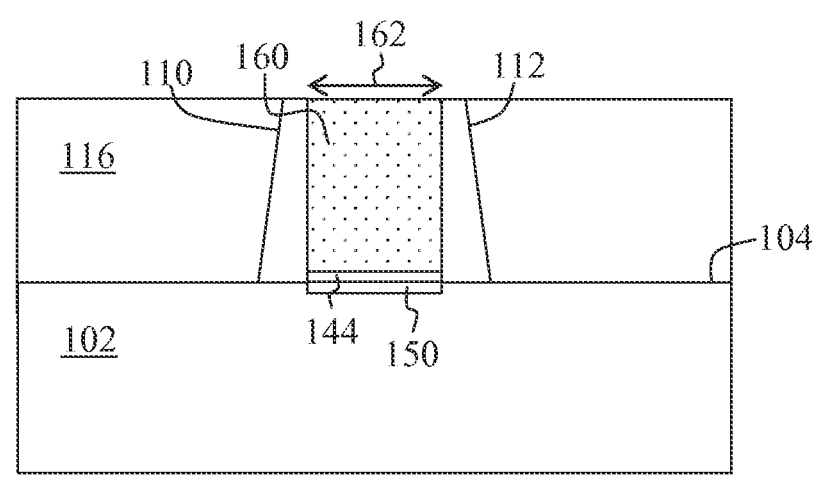

In FIG. 8, a replacement metal gate 160 is formed overlying the metal oxide high-k dielectric layer 144 and in contact with the first spacer 110 and the second spacer 112. For example, an electrode or workfunction metal or layers of electrode or workfunction metals are deposited overlying the metal oxide high-k dielectric layer 144 to fill the recess 120. An overburden of the portion of the layer(s) of electrode or workfunction metal, that is, those materials overlying the surface of the spacers 110 and 112, are removed. For example, a planarization process, such as chemical mechanical planarization (CMP), may be performed to remove all material above the spacers 110 and 112. As a result, the metal gate is contained within the recess 120. As shown, the replacement metal gate 160 has a thickness, indicated by double-headed arrow 162, that is equal to the distance 128 between the first spacer 110 and the second spacer 112.

In an exemplary embodiment, the replacement metal gate 160 is formed on a hafnium oxide high-k dielectric layer 144 and in direct contact with the first spacer 110 and second spacer 112. An exemplary replacement metal gate 160 includes a layer or layers of tantalum nitride, titanium nitride, and tungsten nitride, ruthenium, palladium, platinum, cobalt, nickel, conductive metal oxides, ruthenium oxide, hafnium, zirconium, titanium, tantalum, aluminum, tungsten, hafnium carbide, zirconium carbide, titanium carbide, tantalum carbide, or aluminum carbide, or alloys or metal carbides that including one of the above metals.

The structure of the integrated circuit 100 of FIG. 8 inhibits or reduces the increase in threshold voltage due to reduced gate length exhibited by other metal gate structures. Specifically, by positioning the metal gate closer to the transistor junction, i.e., in contact with the spacers with no high-k dielectric layer positioned between the metal gate and the spacers, the length of the metal gate is increased, thereby reducing the effects of device scaling. Also, the integrated circuit 100 of FIG. 8 provides an interfacial layer of re-formed oxide that exhibits improved performance characteristics as compared to originally formed oxide. Further, the described method avoids a need to etch a high-k dielectric layer from the sidewalls of the spacers 110 and 112 as it selectively forms the high-k dielectric layer only on the surface of the semiconductor substrate and not on the spacer sidewalls.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
exposing a portion of a surface of a semiconductor substrate between a first spacer and a second spacer;
forming an oxide layer at the surface of the semiconductor substrate;
depositing a metal on the oxide layer;
performing a first annealing process to diffuse oxygen from the oxide layer into the metal to form a metal oxide high-k dielectric layer; and
performing a second annealing process to diffuse oxygen from the metal oxide high-k dielectric layer into the semiconductor substrate to grow a reformed oxide layer.

2. The method of claim 1 further comprising depositing a capping material including oxygen onto the metal oxide high-k dielectric layer, wherein performing the second annealing process diffuses oxygen from the capping material through the metal oxide high-k dielectric layer into the semiconductor substrate.

3. The method of claim 2 further comprising removing the capping material after performing the second annealing process.

4. The method of claim 1 further comprising forming a metal gate over the metal oxide high-k dielectric layer and between the first spacer and the second spacer, wherein the metal gate contacts the first spacer and the second spacer.

5. The method of claim 1 wherein the semiconductor substrate includes silicon, and wherein forming the oxide layer at the surface of the semiconductor substrate comprises exposing the silicon to oxygen and oxidizing the silicon to form silicon oxide.

6. The method of claim 1 wherein depositing the metal on the oxide layer comprises depositing hafnium on the oxide layer, and wherein performing a first annealing process to diffuse oxygen from the oxide layer into the metal forms a hafnium oxide high-k dielectric layer.

7. The method of claim 1 wherein performing the first annealing process to diffuse oxygen from the oxide layer into the metal to form a metal oxide high-k dielectric layer comprises heating the semiconductor substrate to diffuse substantially all of the oxygen from the oxide layer into the metal.

8. The method of claim 1 further comprising forming over the semiconductor substrate the first spacer separated from the second spacer by a gap, wherein forming the oxide layer at the surface of the semiconductor substrate comprises forming the oxide layer at the surface of the semiconductor substrate in the gap between the first spacer and the second spacer.

9. A method for fabricating an integrated circuit, the method comprising:
provinding a semiconductor substrate having a surface;
forming an oxide layer at the surface of the semiconductor substrate;
depositing a metal overlying the semiconductor substrate to form a metal layer with a bottom surface and a top surface;
diffusing oxygen from the oxide layer through the bottom surface of the metal and forming a metal oxide high-k dielectric layer;
depositing a capping material including oxygen onto the metal oxide high-k dielectric layer; and
after forming the metal oxide high-k dielectric layer, diffusing oxygen from the capping material through the surface of the semiconductor substrate to form an interfacial oxide layer.

10. The method of claim 9 wherein depositing the metal overlying the semiconductor substrate comprises depositing the metal on to the oxide layer.

11. The method of claim 9 wherein diffusing oxygen through the bottom surface of the metal and forming the metal oxide high-k dielectric layer comprises performing a first annealing process, and wherein diffusing oxygen through the surface of the semiconductor substrate to form the interfacial oxide layer comprises performing a second annealing process to grow the interfacial oxide layer as a reformed oxide layer.

12. The method of claim 10 wherein diffusing oxygen from the oxide layer into the metal layer comprises heating the semiconductor substrate to diffuse substantially all of the oxygen from the oxide layer into the metal layer.

13. The method of claim 9 further comprising:
removing the capping material after diffusing oxygen through the surface of the semiconductor substrate to form the interfacial oxide layer.

14. A method for fabricating an integrated circuit, the method comprising:
forming a sacrificial gate structure over a semiconductor substrate and between first and second spacers;
removing the sacrificial gate structure to form a trench exposing a surface portion of the semiconductor substrate;
oxidizing the surface portion of the surface of the semiconductor substrate to form an oxide layer;
depositing a metal on the oxide layer to form a metal layer, wherein the metal layer has an exposed top surface; and
performing an annealing process to diffuse oxygen from the oxide layer through the metal and to the exposed top surface of the metal layer to form a metal oxide high-k dielectric layer with an exposed top surface, wherein performing the annealing process comprises eliminating the oxide layer, and wherein the metal oxide high-k dielectric layer is formed in direct contact with the semiconductor substrate.

15. The method of claim 14 wherein the first and second spacers have top edges, wherein depositing the metal on the oxide layer comprises depositing the metal on the oxide layer and over the top edges of the first and second spacers, and wherein the method further comprises removing the metal from over the top edges of the first and second spacers.

16. The method of claim 14 further comprising:
depositing a capping material including oxygen onto the exposed top surface of the metal oxide high-k dielectric layer; and
diffusing oxygen from the capping material through the metal oxide high-k dielectric layer into the semiconductor substrate.

17. The method of claim 14 further comprising depositing a metal gate material on the exposed top surface of the metal oxide high-k dielectric layer and in contact with the first and second spacers.

* * * * *